(12) United States Patent
Skrzypchak et al.

(10) Patent No.: US 6,604,494 B2
(45) Date of Patent: *Aug. 12, 2003

(54) WATER-COOLED ENGINE CONTROL

(75) Inventors: Mark J. Skrzypchak, Pleasant Prairie, WI (US); Michael J. French, Pleasant Prairie, WI (US); Gregry M. Remmers, Ingleside, IL (US); Scott A. Koerner, Kenosha, WI (US); Philip J. Bylsma, Brookfield, WI (US); Mike A. Tanner, Zion, IL (US); Dale A. Wiegele, Kenosha, WI (US)

(73) Assignee: Bombardier Motor Corporation of America, Grant, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/448,368

(22) Filed: Nov. 23, 1999

(65) Prior Publication Data

US 2002/0166519 A1 Nov. 14, 2002

Related U.S. Application Data

(60) Provisional application No. 60/109,716, filed on Nov. 24, 1998.

(51) Int. Cl.$^7$ .................................................. F01P 1/06
(52) U.S. Cl. ....................... 123/41.31; 440/88; 361/699
(58) Field of Search ......................... 123/41.31; 440/88; 361/699, 701

(56) References Cited

U.S. PATENT DOCUMENTS

| | | | |
|---|---|---|---|
| 4,109,707 A | * 8/1978 | Wilson et al. | 165/46 |
| 4,729,424 A | * 3/1988 | Mizuno et al. | 165/30 |
| 4,893,590 A | * 1/1990 | Kashimura et al. | 123/41.31 |
| 5,078,627 A | * 1/1992 | Anderson | 440/1 |
| 6,173,759 B1 | * 1/2001 | Galyon et al. | 165/80.4 |
| 6,182,742 B1 | * 2/2001 | Takahashi et al. | 165/104.33 |

* cited by examiner

Primary Examiner—Tony M. Argenbright
Assistant Examiner—Katrina B. Harris

(57) ABSTRACT

An electronic control unit for a combustion engine having a water coolant passageway in heat transfer adjacency to the unit and adapted to remove heat from the unit. An ECU for combustion engine, comprising: electrical input circuits, electrical control circuits, electrical fuel injection output drive circuits, electrical oil pump output drive circuits and electrical ignition circuits. An ECU is disclosed which is adapted to verify firing of the ignition coils of the engine.

31 Claims, 11 Drawing Sheets

WATER-COOLED ENGINE CONTROL

CROSS-REFERENCE TO RELATED APPLICATIONS

This application claims the benefit of U.S. Provisional Patent Application serial No. 60/109,716 filed Nov. 24, 1998.

BACKGROUND OF THE INVENTION

This invention relates generally to combustion engines and, more particularly, to electronic control units for such engines.

Known combustion engines for use with watercraft include an air-cooled electronic control units (ECU) for controlling at least some operations of the engine. With increased processing demand and an increase in the number of ECU electronic components, a need has developed for improved cooling as compared to the cooling provided by the known air cooling configurations. In addition, with known ECU configurations, testing of the ignition coils has been limited to transmitting commands to cause such coils to fire without verification as to whether the coils actually did fire.

BRIEF SUMMARY OF THE INVENTION

It would be desirable to increase the amount of circuitry in the ECU to include heat-generating circuitry without the generated heat causing the ECU to malfunction. It would also be useful to allow the ECU to check the ignition coils and determine whether or not they are operational.

One embodiment provides a water cooled ECU in order to allow more electrical components to be present in the ECU. The ECU also is able to not only cause the ignition coils to fire, but also to verify whether such coils did, in fact, fire.

A water-cooled configuration for the ECU provides enhanced cooling as compared to known air-cooled configurations. The water-cooled ECU is configured to contain portions of the ignition circuit, which has previously been outside the ECU.

DETAILED DESCRIPTION OF THE INVENTION

Figure 1:
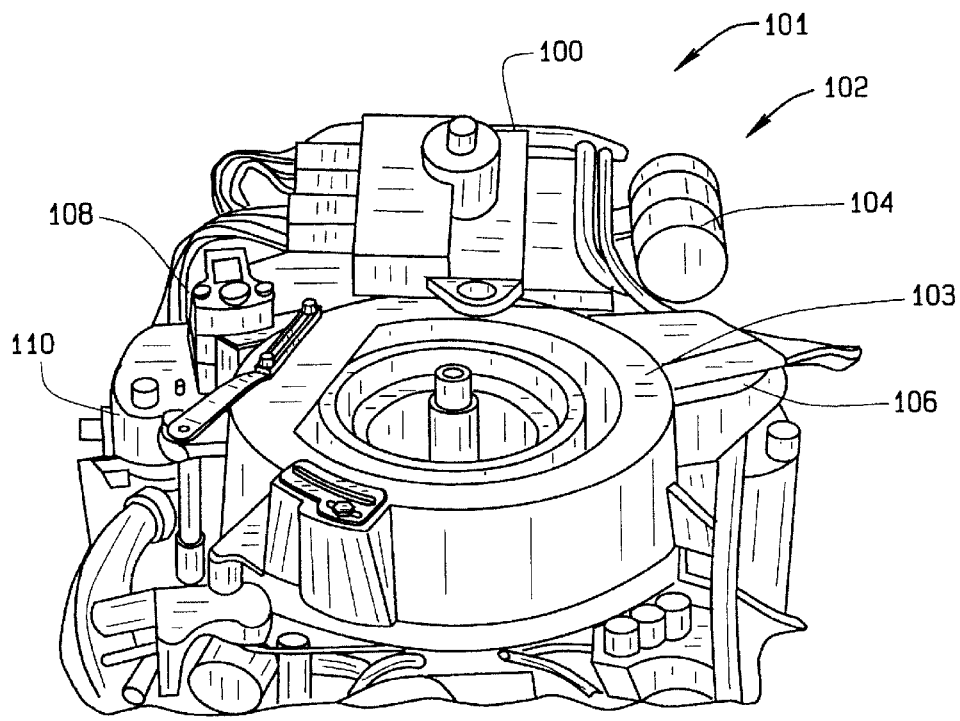
FIG. 1 is a top front perspective view of a marine outboard combustion engine, incorporating a preferred embodiment of the invention.

FIG. 1 is a top front perspective view of an electronic control unit (ECU) 100 connected to a marine outboard combustion engine 101. Unit 100 is located in a powerhead 102. Powerhead 102 also contains a flywheel cover 103 and a capacitor 104. It will be understood that this location of ECU 100 is exemplary and ECU 100 could be located anywhere that is practical and desired on engine 101. ECU 100 includes a water-cooled (in a manner described below) housing containing a microprocessor that receives sensor, switch and electrical signals and power that provides information on engine operating conditions in powerhead 102, interprets those signals, and generates commands to the various components that are connected to ECU 100. In addition to controlling engine operation, ECU 100 has a number of other important programmed functions. ECU 100 stores service codes, activates a warning system, provides choke-less cold starting, controls engine monitoring gauge lights, generates a tachometer signal, prevents excessive engine RPM, provides an initial break-in oil ratio that is twice normal rate, controls electric fuel pump operation, and records engine operating hours. ECU 100 is an EEPROM design, so service codes will not be lost if battery power to ECU 100 is lost. Stored service codes that have not reoccurred for 15 or more running hours will automatically be eliminated from memory.

A crankshaft position sensor 106 is located on a first side of powerhead 102, and a throttle position sensor 108 and starter solenoid 110 are located on a second side of powerhead 102. In addition, timing pointers 112 and 114 are on flywheel cover 103 for purposes of timing, respectively, the four cylinder and the six cylinder version of engine 100.

Figure 2:
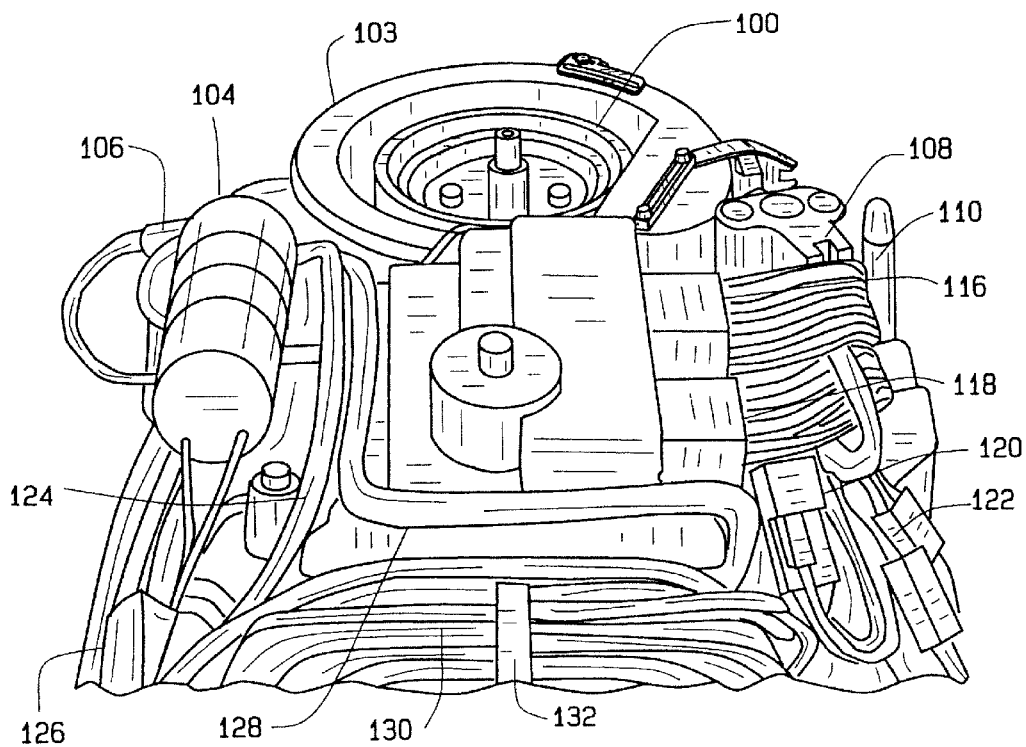
FIG. 2 is a top rear perspective view of the engine of FIG. 1.

FIG. 2 is a top, rear, perspective view of marine outboard combustion engine 101. In FIG. 2, ECU 100 is mounted adjacent capacitor 104 and above and behind flywheel cover 103, although, as stated above, this position could be anywhere that is desired. ECU 100 has two electrical harness connectors, a forward connector 116, and a rear connector 118. Engine 101 also includes a main power relay 120, a water temperature switch 122 and a water temperature sensor 126. A vapor separator vent hose 124 leads to a vapor separator (not shown). A water hose 128 from the vapor separator wraps around ECU 100. Several fuel hoses 130 are connected to a fuel junction block 132. Engine 100 has a throttle position sensor 108 used to determine the actual throttle position.

Figure 3:
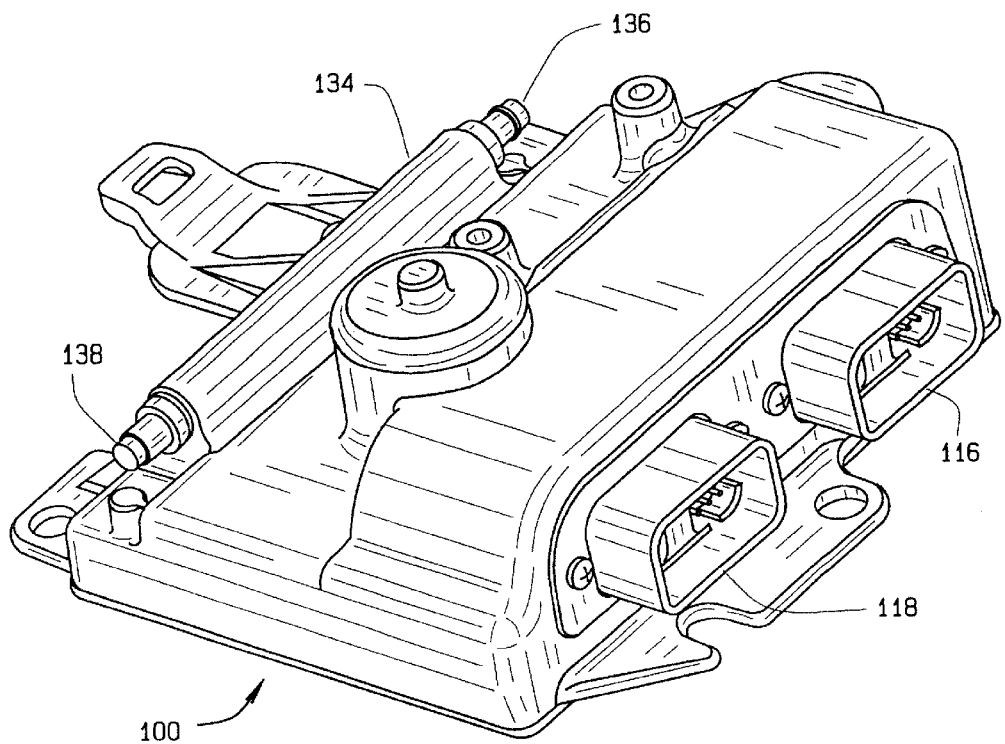
FIG. 3 is a top, left, rear perspective view of an electronic control unit for use with the engine of FIG. 1.

FIG. 3 is a perspective view of ECU 100. A water passage 134 is disposed in heat transfer adjacency to a portion of ECU 100. Water passage 134 has a water hose connector 136, 138 at either end, and serves as a heat exchanger to cool ECU 100 by transferring heat from ECU 100 into water flowing through water passage 134. Water passageway 134 lies horizontal, but could be oriented vertically, if desired. The flow through passageway 134 could be driven by a water pump or could be by convection, since hot water naturally rises and cold water settles. Convection flow, which occurs naturally in response to heating of water makes the coolant flow more dependable since it depends solely on physical principles without moving parts. Pump driven flow is likely to be at higher flow rates and thus able to cool more effectively, but is more likely to be subject to mechanical breakdown. Which is used depends on the amount of cooling needed.

In addition to sensors (described below) located outside of ECU 100, any desired number of sensors (not shown in FIG. 3) are located inside ECU 100. Sensors can be conventional sensors. Sensors can, by way of example, be sensors for barometric pressure, control unit temperature, alternator voltage (26 volts), battery voltage (12 volts), and ROM verification.

The barometric pressure sensor is a silicon pressure sensor having diaphragm-sealed air passages that generates an alternating current voltage signal. It senses ambient air pressure through a screened port that is open to atmosphere. The barometric pressure signal enables ECU 100 to compensate for changes in altitude and air density up to 14,000 feet (4267 m) so it can adjust fuel flow accordingly. If sensed values are out of limits, or the sensor or circuit fails, ECU 100 will turn on a "CHECK ENGINE" light, and store a service code.

ECU 100 temperature sensor, also inside ECU 100, monitors fuel injector driver circuit temperature to prevent that circuitry from exceeding design limits. One or more fuel injectors could malfunction should this occur. If sensor values are out of limits, or the sensor circuit fails, ECU 100 will turn on the "CHECK ENGINE" light, and store a service code. ECU 100 will also initiate a special "SLOW" warning system, but only if excessive temperature is the failure mode.

The 26-volt circuit sensor monitors the rectifier/regulator 26-volt output. This is the circuit the powers the field injectors. If voltage exceeds the expected range, ECU 100 will initiate "SLOW", store a service code, and turn on the "CHECK ENGINE" light. Voltage below the expected range will store a service code and turn on the "CHECK ENGINE" light, but will not put engine 101 into "SLOW".

The RPM limiter feature of ECU 100 programming prevents engine damage due to excessive engine speed. At 6116 RPM, fuel and ignition to even numbered cylinders are shut off. At 6144 RPM, fuel and ignition to the remaining cylinders are also shut off. Normal operation returns automatically as soon as engine speed drops down to the specified range, in this case below 6116 RPM.

The idle governor reacts to water temperature sensor values. It changes fuel pulse width to maintain engine speed within a range of 650 RPM (warm engine) to about 850 RPM (cold engine). The governor is inactive above about 1200 rpm.

The 12-volt circuit sensor monitors rectifier/regulator 12-volt output. This is the circuit that supplies all 12-volt components/circuit requirements. If voltage is out of limits, high or low, ECU 100 will store a service code and turn on the "CHECK ENGINE" light.

The ROM verification sensor is a continual ECU self-test of factory programming. ECU 100 will turn on the "CHECK ENGINE" light and store a service code if, at any time, a program failure is detected.

Figure 4:
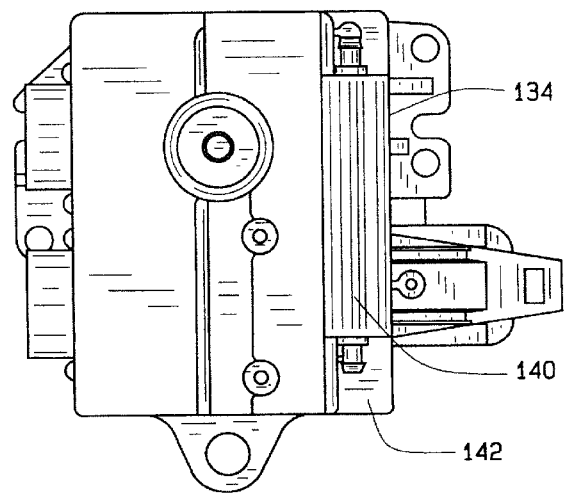
FIG. 4 is a top external view of the ECU of FIG. 3.
Figure 5:
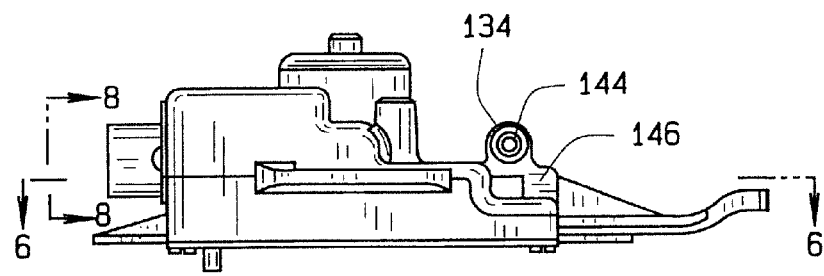
FIG. 5 is a front elevational external view of the ECU of FIG. 4.

FIGS. 4–5 are top and front views of ECU 100. Water passage 134 is enclosed in a metallic housing 140 that has a rounded top 144 and a flat bottom 146 adapted to fit atop a flat top surface 142 of ECU 100 for good heat transfer.

Figure 6:
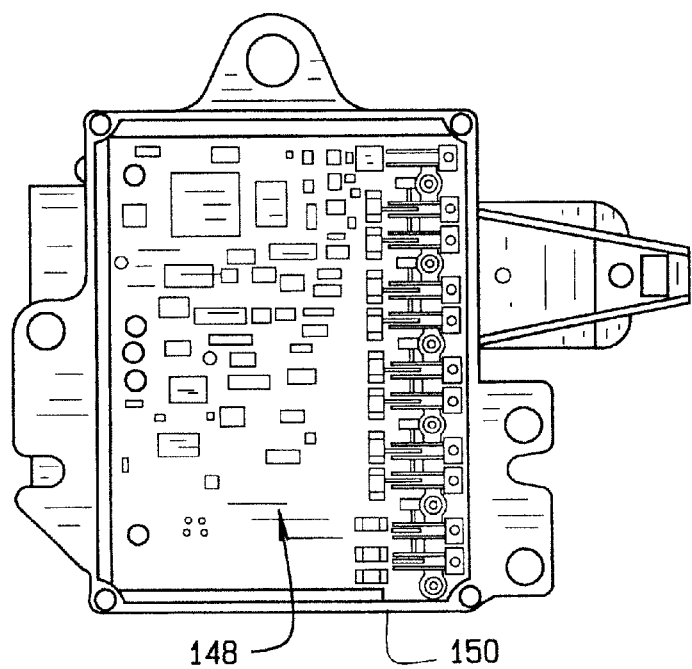
FIG. 6 is a bottom view in cross-section taken along lines 6—6 of FIG. 5.

FIG. 6 is a top plan view in cross-section taken along lines 6—6 of FIG. 5, illustrating the circuitry within the ECU 100. The circuitry is divided into a low-power portion 148 and a high-powered portion 150. It will be understood that high-powered portion 150 is in heat transfer adjacency to the water passage 134 so that the primary sources of heat generated by and within ECU 100 all are in heat transfer adjacency to water passage 134. Placement of water passage 134 directly on top of ECU 100 and in heat transfer adjacency to high-powered portions of electronic circuitry enables high-powered electrical circuitry to be more compactly and densely placed within ECU 100. As electrical circuitry becomes more and more sophisticated, cooling of ECU 100 becomes more and more important.

Figure 7:
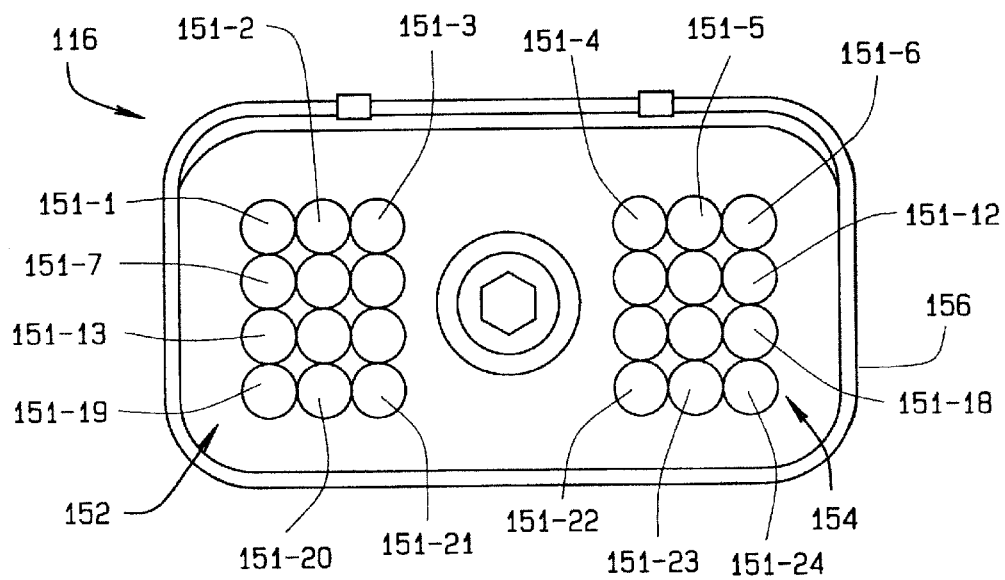
FIG. 7 is a side external view of the forward connector of the ECU of FIGS. 3–6, taken along lines 7—7 of FIG. 4.

FIG. 7 is an external view of forward connector 116 of ECU 100. Coding of the 24 pins 151 labeled 1 through 24 in FIG. 7 in connector 116 is merely an exemplary embodiment and not the only coding which may be used. Pins 151 could be smaller than shown and could be electrically spaced to prevent cross signals and cross currents. Connector 116 has a plurality of pins positioned in two parallel arrays 152, 154 of 12 pins each, commonly located within a rectangular wall shield 156, but other arrangements could be utilized. For example, pins 151 and shield 156 could be located on the wiring and corresponding sockets located in ECU 100.

Figure 8:
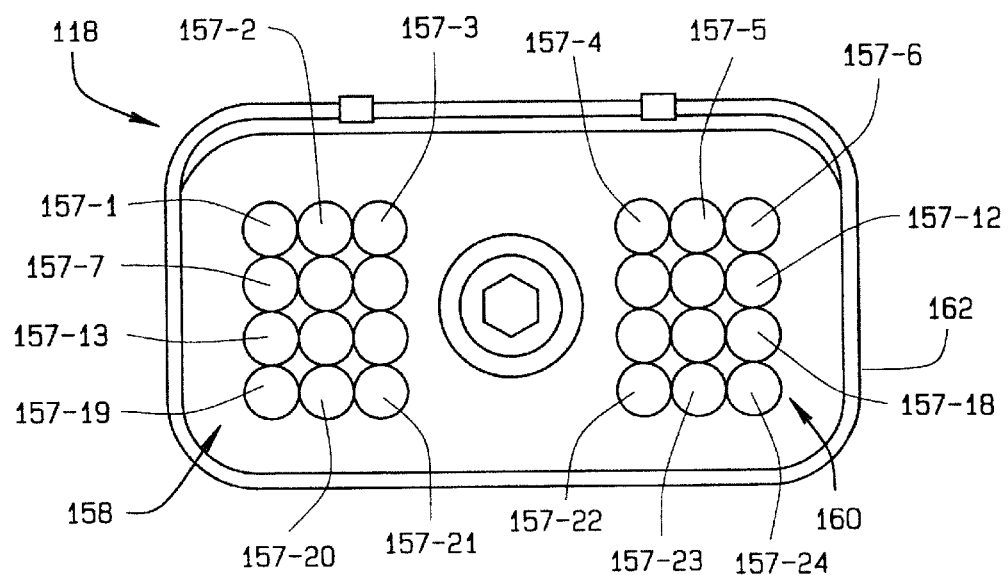
FIG. 8 is an external view of the rear connector of the ECU of FIGS. 3–6 taken along lines 8—8 of FIG. 5 and lines 7—7 of FIG. 6.

FIG. 8 is an external view of rear connector 118 of ECU 100. It will be appreciated that coding of the 24 pins 157 labeled 1 through 24 in FIG. 8 in connector 118 is merely a preferred embodiment and not the only coding which may be used. Pins 157 could be smaller than shown and could be electrically spaced to prevent cross signals and cross currents. Further, while connector 118 is shown as being a plurality of pins 157 positioned in two parallel arrays 158, 160 of 12 pins each, commonly located within a rectangular wall shield 162, other arrangements could be utilized. For example, pins 157 and shield 162 could be located on the wiring and corresponding sockets located in ECU 100.

Figure 9:
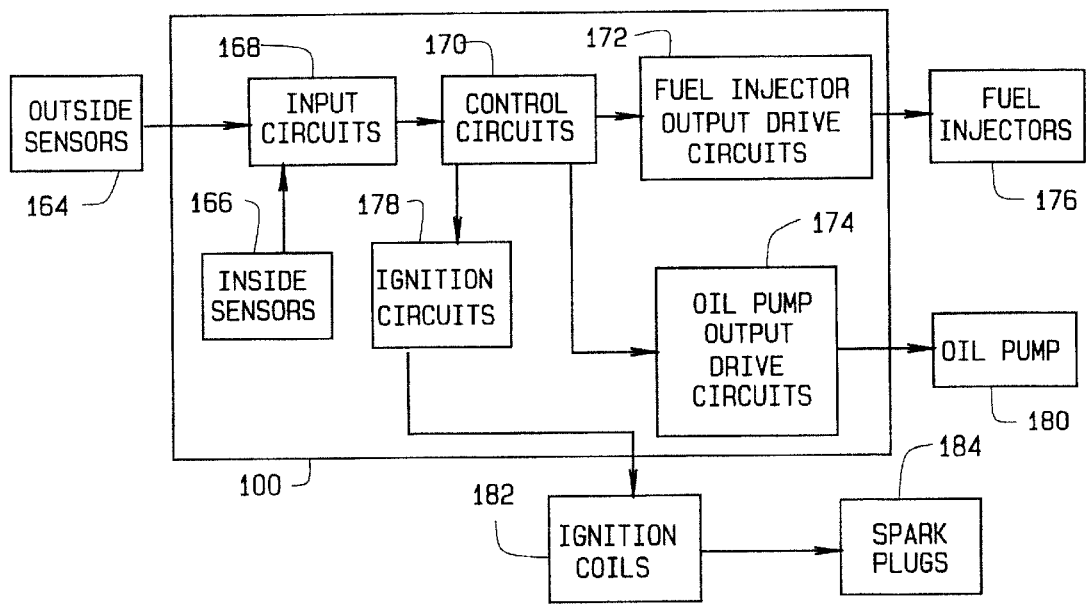
FIG. 9 is a block diagram illustrating the information flow through the ECU of FIGS. 3–6.

FIG. 9 is a block diagram illustrating ECU 100. FIG. 9 is laid out in logic sequence showing portions that are contained within ECU 100 and the portions that are outside of ECU 100. Specifically, sensors such as water temperature sensor 126 and throttle position sensor 110 and various other sensors in powerhead 102 and elsewhere in engine 101, collectively referred to as sensors 164 are outside of ECU 100. The signals from sensors 164 are connected through the electrical wiring harness connectors to input circuits 168 within the ECU 100. In addition to sensors 164 located outside ECU 100 are various sensors located inside ECU 100, which are collectively numbered 166. Sensors 166 are also connected to input circuits 168. Input circuits 168 perform certain receiving, conversion and other functions with respect to those sensors and generate output data that is fed to control circuits 170. Circuits 170 analyze output data from input circuits 168 and generate control signals to various circuits within ECU 100. Some of these various circuits which receive control signals from control circuits 170 are fuel injector output drive circuits 172, oil pump output drive circuits 174 and ignition circuits 178. Of particular note is that ignition circuits 178 are located within ECU 100, which is in contrast to prior art. This is allowed, in part, by water-cooled nature of ECU 100, such as is exemplified by presence of water passage 134 in heat transfer adjacency to ECU 100. Circuits 178 have ability to determine whether or not ignition coils have fired, since circuits 178 are within ECU 100 and are thus microprocessor based. This is in contrast to prior art ECUs which placed the ignition circuit outside of ECU 100 and thus did not allow such verification of firing. Fuel injector output drive circuits 172 receive control signals from control circuits 170 and transmit operational signals to fuel injectors 176. Oil pump output drive circuits receive control signals from control circuits 170 and transmit operational signals to oil pump 180. Ignition circuits 178, similarly, receive control signals from control circuits 170 and selectively allow ignition power to ignition coils 182, which, in turn, provide high voltage current at precise intervals to spark plugs 184 to generate ignition sparks which power engine 101.

Figure 10:
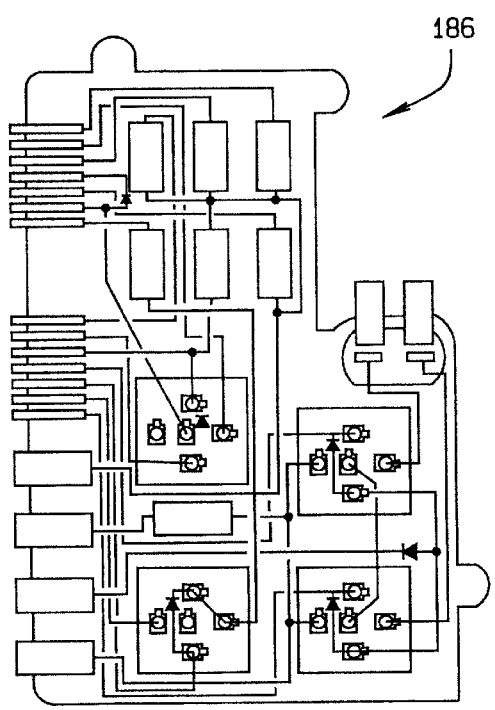
FIG. 10 is a block diagram illustrating a power distribution panel for the ECU of FIGS. 3–6.

FIG. 10 is a block diagram illustrating a power distribution panel 186 for ECU 100. Panel 186 includes various relays, uses and color-coded wiring. Many of these are connections to parts of engine 101 other than ECU 100. It will be understood that FIG. 10 is provided primarily for purposes of background information and enablement and not as any kind of limitation. Panel 186 can include any desired number and type of power connections or components. Panel 186 includes a 12 volt supply to ECU 100 through a fuse, a switched 12 volt connection to ECU 100, a 26 volt supply to ECU 100, an ECU connection to the fuel pump relay, and any other signal which is needed to power engine 101 under the direction of ECU 100.

Figure 11:
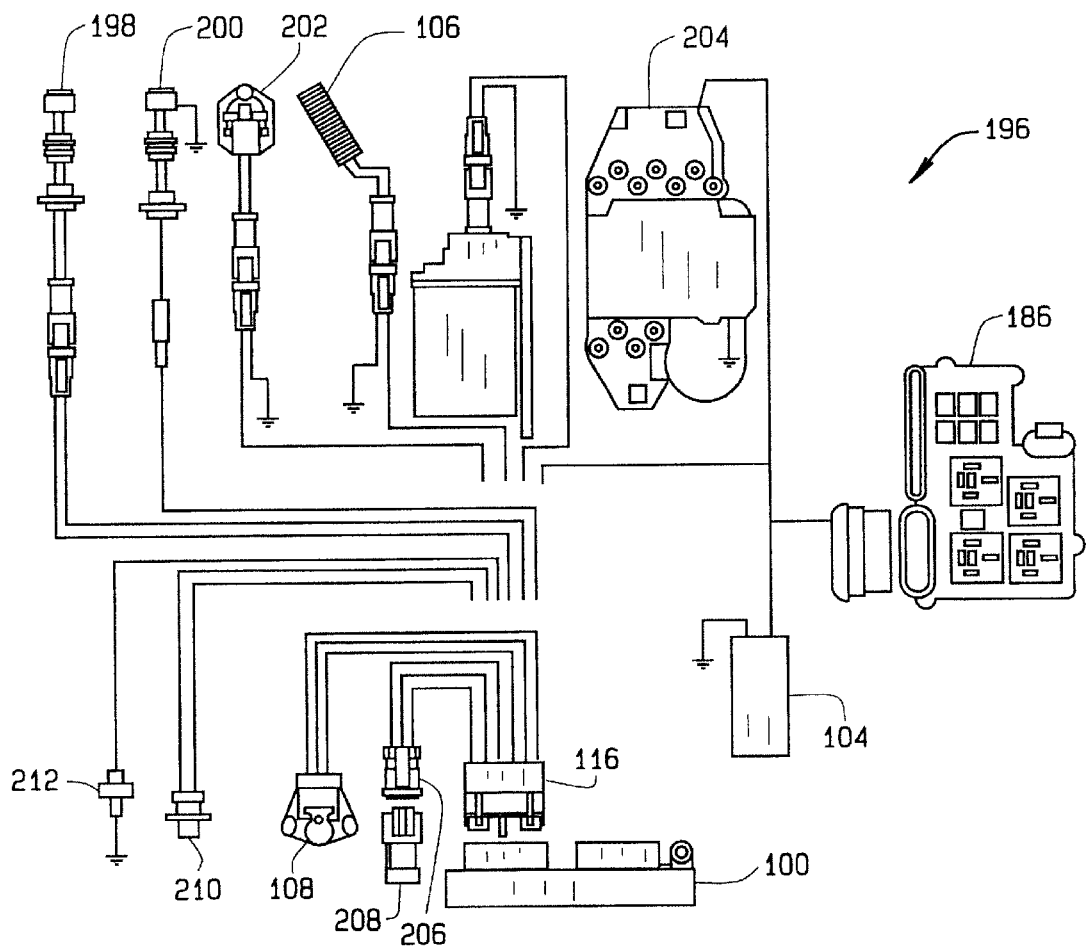
FIG. 11 is a block diagram of the sensor and circuit switch module of the ECU of FIGS. 3–6.

FIG. 11 is a block diagram of sensor and circuit switches included within external portion 196 of the sensing and switching system for engine 101 with which ECU 100. FIG. 11 shows switches and sensors that are external to ECU 100 of FIGS. 3–6. FIG. 11 shows sensors 164 that are connected through front electrical wiring harness connector 116 to input circuits 168 in ECU 100. It is preferable to use a separate wiring harness connector for the sensors/switches and the command controls/power signals. Among the sensors and switches in FIG. 11 are water temperature sensor 198, water temperature switch 200, shift interrupt switch 202, crankshaft position sensor 106, rectifier/regulator 204, capacitor 104, power distributions panel 186, diagnostic connector 206, 208, throttle position sensor 108, air temperature sensor 210 and an oil pressure switch 212. The color coding of wiring used to interconnect these circuits and ECU 100 are listed in a table below FIG. 11 for correspondence with coding shown in FIG. 7 and FIG. 8. As noted previously, there is no particular magic to color-coding used, except that it is intended to make repair jobs easier for repairmen. In this regard, special attention is directed to diagnostic connector 206, 208 that connects to ECU 100 and thereby to start a diagnostic routine within ECU 100 and also connects to a diagnostic unit (not shown) such as might be used by a repairman.

Air temperature sensor 210 monitors temperature of air entering an air silencer. Sensor 210 is a positive temperature coefficient thermistor. A thermistor, as used herein, is a resistor whose resistance changes with temperature and alters voltage values accordingly. When temperature increases both resistance and voltage also increase. When temperature decreases, resistance and voltage likewise decrease. Sensor 210 receives a voltage signal from ECU 100, another wire provides a ground circuit back to ECU 100. ECU 100 uses this signal to adjust air/fuel ratio in accordance with changes in incoming air temperatures. If sensor 210 senses values out of limits, or sensor 210 or its circuit fails, ECU 100 will store a service code and turn on the "CHECK ENGINE" light.

Water temperature switch 200 is located in starboard cylinder head (shown below). Switch 200 threads into a seat (not shown) in the water passage of the starboard cylinder head, but does not actually contact water. Switch 200 monitors water temperature to protect against an engine overheating. Its operation differs somewhat from the water temperature sensor 198 in that switch 200 is an on/off switch, not a thermistor. Switch 200 receives a voltage signal from ECU 100, and if powerhead temperature exceeds switch limits, a circuit grounds and ECU 100 will initiate SLOW, store a service code, and turn on a "WATER TEMP" light.

The water temperature sensor 198 is located in the port cylinder head (shown below.) It threads into a seat in the water passage of the head, but does not actually contact the water. The sensor has a dual purpose; it provides data to ECU 100 primarily for use in adjusting the air/fuel ratio during engine warm-up, and it will trigger the "system check" warning gauge when engine 101 overheats. The water temperature sensor is also a positive temperature coefficient thermistor, a resistor whose resistance changes with temperature. When temperature increases, both resistance and voltage also increase. Sensor 198 receives a voltage signal from ECU 100, and another wire provides a ground circuit back to ECU 100. ECU 100 uses this signal to adjust the air/fuel ratio in accordance with changes in powerhead water temperature. If sensor 198 senses values are above the limits, indicating an engine over heat condition, ECU 100 will initiate SLOW, store a service code, and turn on a "WATER TEMP" light.

The shift interrupt switch 202, which is used for six-cylinder engines only, is in contact with a shift lever. The switch is normally open. When the button is depressed (by excessive shift loads), the switch is closed and completes a ground circuit. ECU 100 momentarily shuts off fuel and spark to three cylinders (for example, Nos. 2,4,6) to momentarily reduce drive train loads and ease shifting, then automatically restores normal engine operation. The signal threshold can be, for example, 2144 RPM and the shift interrupt function will not work above it. Switch 202 must be released to its normally open position before the interrupt circuit can be actuated again. ECU 100 provides a voltage signal to the shift interrupt switch; another wire connects the switch to a powerhead ground. If the switch or its circuit fails, ECU 100 will store a service code and turn on the "CHECK ENGINE" light.

The throttle position sensor 108 is a rotary potentiometer located near flywheel cover 103, and contacts a vertical throttle shaft. Sensor 108 receives a voltage signal from ECU 100. As the throttle lever is rotated, ECU 100 receives a return voltage signal through a second wire. This return voltage signal is relative to the position of the throttle shaft. As the throttle opens, voltage increases. As the throttle closes, voltage decreases. A third wire completes the ground circuit back to ECU 100. If sensed values are out of limits, or sensor 108 or its circuit fails, ECU 100 will turn on the "CHECK ENGINE" light, store a service code, and automatically reduce engine speed to idle. Once a throttle position circuit fault has been detected by sensor 108 and ECU 100, engine 101 will not accelerate above idle speed. To reset, engine 101 must be stopped and the fault corrected.

The crankshaft position sensor 106 is an electromagnetic device that generates a magnetic field that is interrupted by flywheel encoder ribs passing through it. This produces an alternating current voltage signal directly related to flywheel speed. Crankshaft top dead center position is determined by encoder rib spacing. Sensor 106 feeds the flywheel encoder data to ECU 100, which calculates timing position and engine speed. ECU 100 generates a tachometer signal, and controls fuel injector and ignition operation. Sensor 106 is located adjacent to flywheel cover 103 and, for example, requires a 0.050 plus or minus 0.005 inches (1.27 plus or minus 0.127 mm) sensor-to-flywheel air gap to operate properly. If sensor 106 fails, engine 101 will not run. If the air gap is incorrect, engine 100 will run erratically. A sensor 106 that is damaged o r out of adjustment will cause ECU 100 to turn on the "CHECK ENGINE" light and store a service code, but only if the failure occurs while engine 101 is running.

Diagnostic connector 206 provides for a connection to a suitable computer having diagnostic software thereon, such as the proprietary OMC FFI™ diagnostic software. The software allows a technician to do many useful things, such as actuate individual fuel injectors and spark plugs on individual cylinders, test oil injector operation, run the electric fuel circulation pump, perform cylinder drop tests, display real-time sensor values and system voltages, display switch conditions and engine operating parameters, verify engine and computer timing, retrieve and clear stored service codes, display accumulated engine hours, display recorded engine hours within six operational speed ranges, initiate a replacement powerhead oil break-in program, print and save the service report, install and service a replacement injector, and install and service a replacement electronic control unit. This software could also be designed to include any other desired service function, and is generally described here only for purposes of completeness. The specific diagnostic software is not part of the present invention, but is described in detail in a separate co-pending application.

Figure 12:
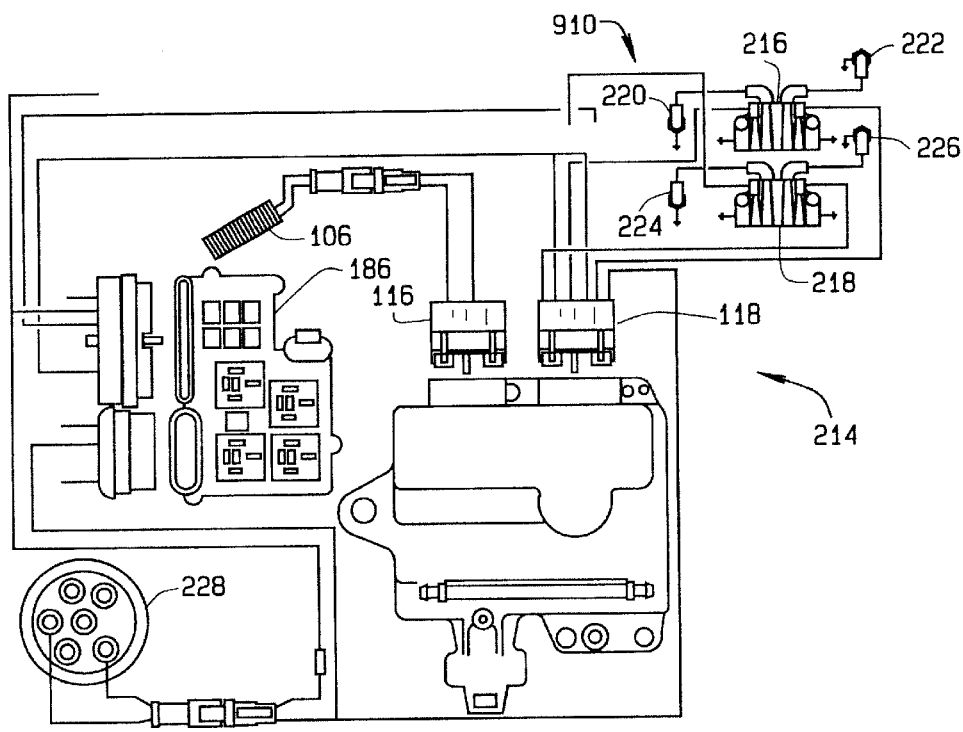
FIG. 12 is a block diagram of the ignition circuit of the ECU of FIGS. 3–6 for a four-cylinder engine.

FIG. 12 is a block diagram of a portion 214 of an ignition circuit 178 for powerhead 102 which is external to ECU 100, and specifically for a four-cylinder engine. Portion 214 includes ignition coils 182 and spark plugs 184. Portion 214 connects primarily to connector 118, but also includes crankshaft position sensor 106, which is connected to input circuits 168 (shown in FIG. 9) of ECU 100 through connector 116. The power connections to and from power distribution panel 186 are made through connector 118 to dual ignition coils 216, 218 for the cylinders as shown. Coils 216, 218 lead to spark plugs 220, 222, 224 and 226. Portion 214 further includes a key switch 228 to provide security to the starting function of engine 101.

Figure 13:
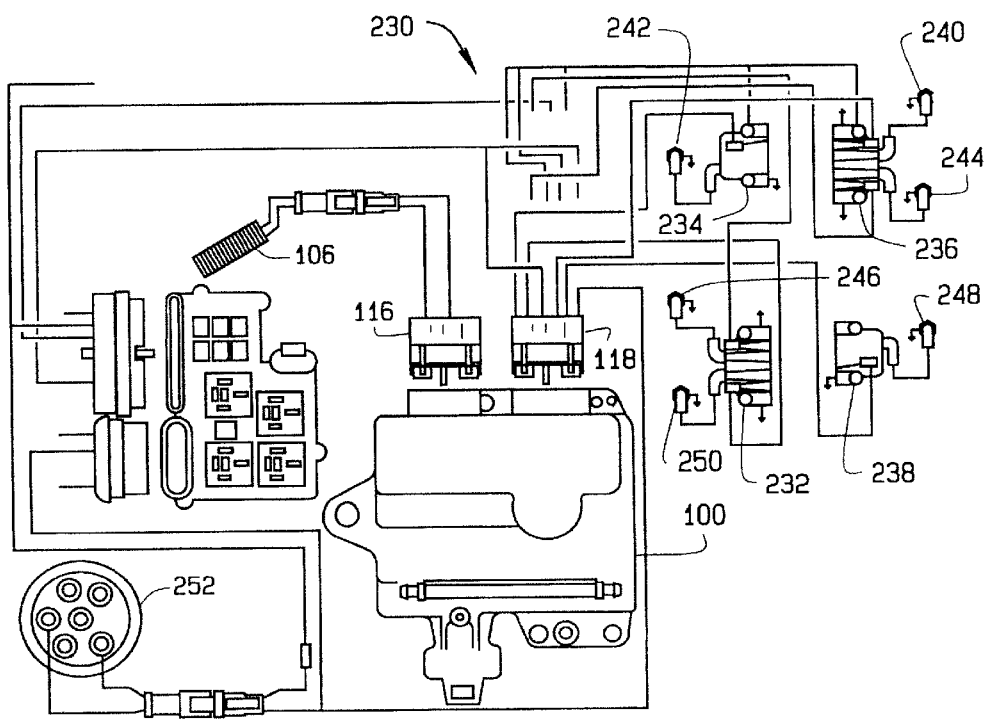
FIG. 13 is a block diagram of the ignition circuit of the ECU of FIGS. 3–6 for a six-cylinder engine.

FIG. 13 is a block diagram of portion 230 of another ignition circuit 178 for powerhead 102 which is external to ECU 100 and which is specifically for a six-cylinder engine. It will be understood that portion 230 connects primarily to connector 118, but also includes crankshaft position sensor 106, which is connected is to input circuits 168 (shown in FIG. 9) through connector 116. The power connections to and from panel 186 are shown to be connected through connector 118 to the ignition coils 232, 234, 236, and 238. Coils 232, 234, 236, and 238 are, in turn, connected to spark plugs 240, 242, 244, 246, 248 and 250. A key switch 252 provides security to the starting function of engine 101.

Figure 14:
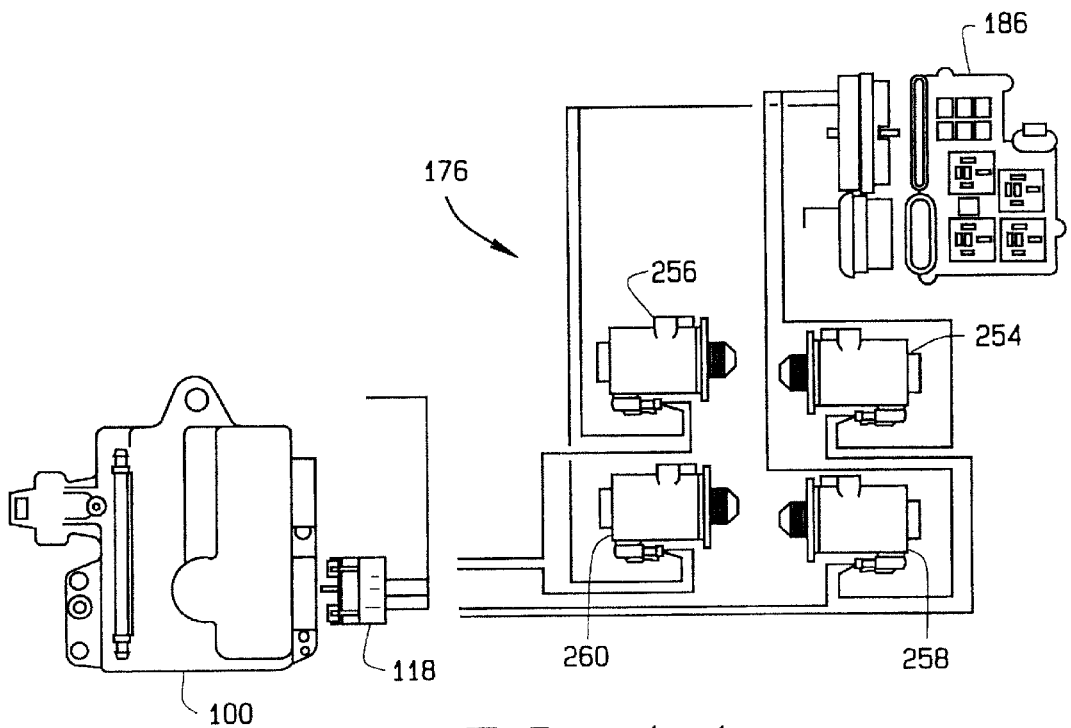
FIG. 14 is a block diagram of a fuel injector circuit for a four-cylinder engine, showing the connections to the ECU of FIGS. 3–6.

FIG. 14 is a block diagram of a fuel injector circuit 176 for a four-cylinder engine, showing connections to fuel injector output drives circuits 172 of ECU 100. Power for operation of fuel injectors is also provided by power distribution panel 186 through rear electrical wiring harness connector 118. Power is then provided within ECU 100 to fuel injector output drive circuits 172, (shown in FIG. 9) and from circuits 172 out of ECU 100 through rear electrical wiring harness connector 118 to four fuel injectors 254, 256, 258 and 260.

Figure 15:
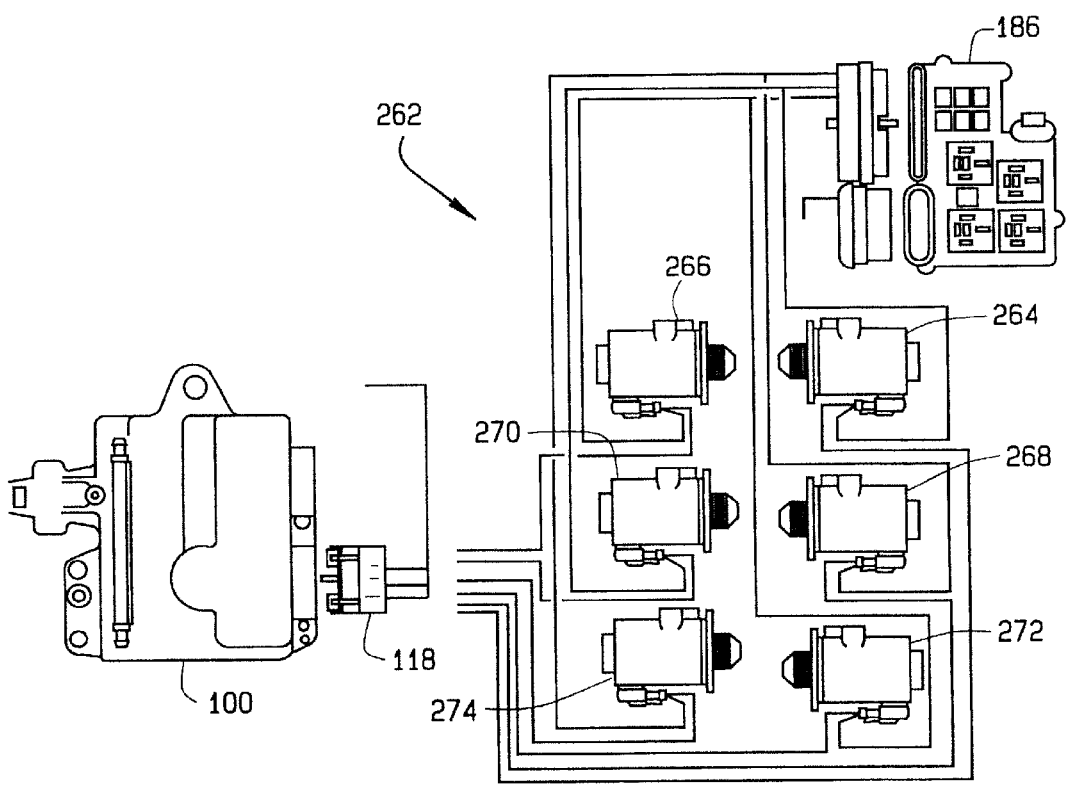
FIG. 15 is a block diagram of a fuel injector circuit for a six-cylinder engine, showing the connections to the ECU of FIGS. 3–6.

FIG. 15 is a block diagram of a fuel injector circuit 262 for a six-cylinder engine, showing connections to fuel injector output drives circuits 172. Power for operation of fuel injectors is provided by power distribution panel 186 through the rear electrical wiring harness connector 118 to fuel injector output drives circuits 172, (shown in FIG. 9) and from circuits 172 back through rear electrical wiring harness connector 118 to six fuel injectors 264, 266, 268, 270, 272 and 274.

Figure 16:
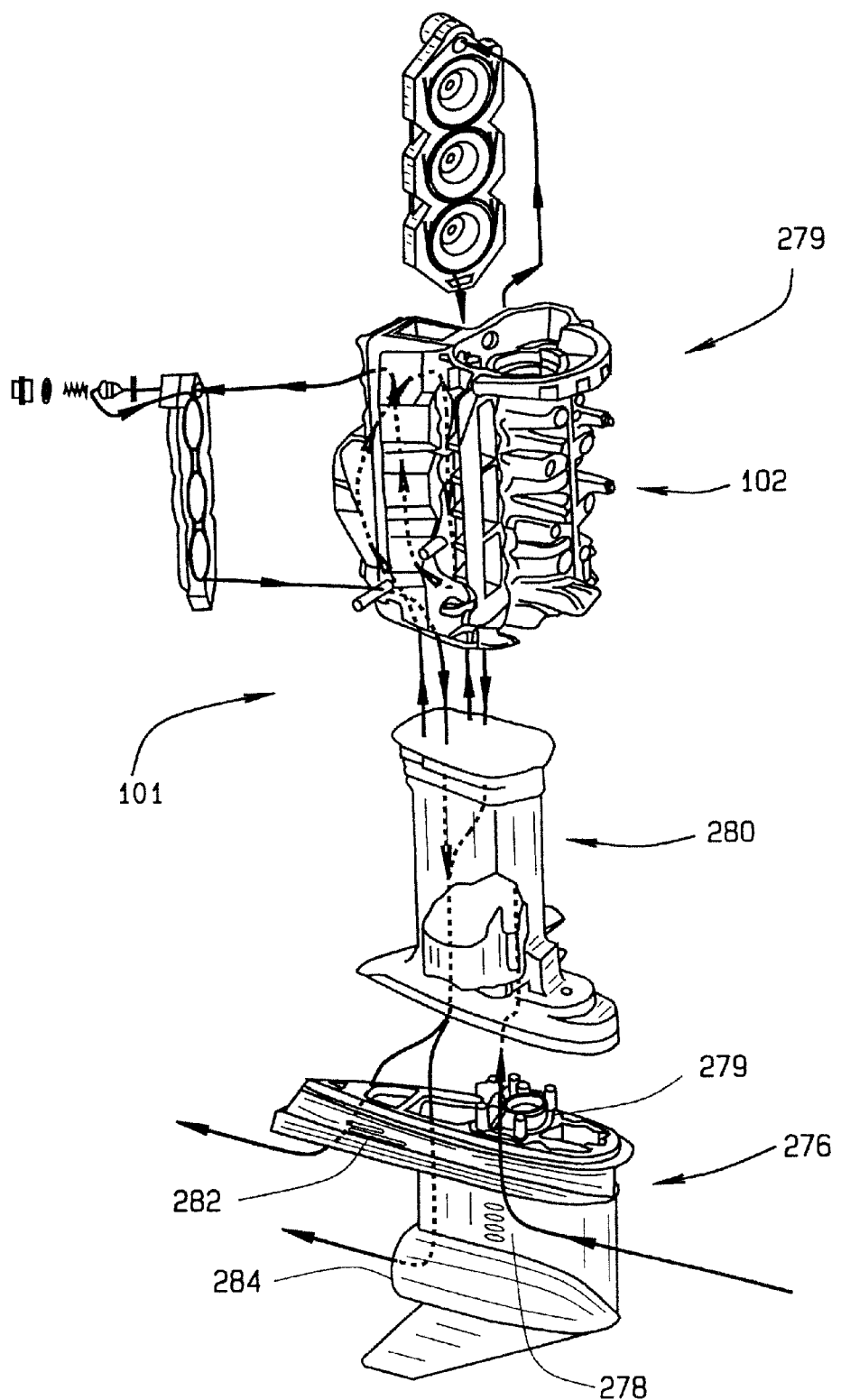
FIG. 16 is a left, front, top exterior exploded perspective view in partial cutaway to show the cooling water flow through a marine outboard engine adapted for use with the ECU of FIGS. 1–3.

FIG. 16 is a left, front, top exterior exploded perspective view of a portion of an outboard engine in partial cutaway to show one exemplary flow pattern for a coolant system 279 for cooling water flow through engine 101 when adapted for use with ECU 100 of FIGS. 1–3. Cooling water enters lower unit 276 through water intake openings 278 and passes upwardly through lower unit 276 into a mid-section 280 into powerhead 102. This cooling water them circulates within powerhead 102 to cool appropriate components and then exits downwardly through mid-section 280 and out of water vents 282 or out of prop mounting cavity openings 284. This completes the water cooling circuit. The water will be circulated in powerhead 102 in the manner shown below in FIG. 17. It will be recognized that although an outboard engine 101 is shown, and inboard or inboard/outboard engine could be substituted for engine 101. It will also be understood that the water may flow in heat transfer adjacency with a fuel pump in the engine.

Figure 17:
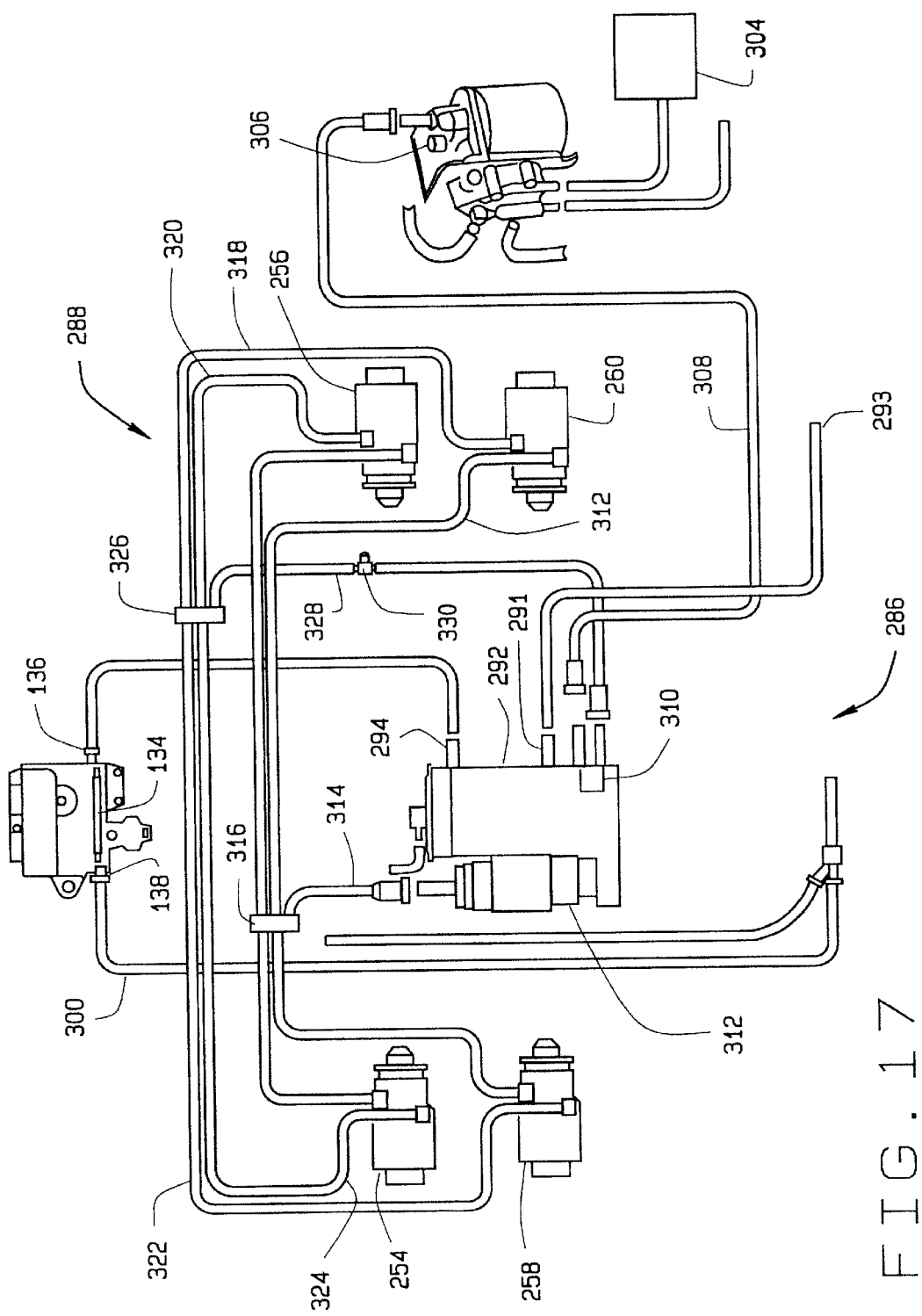
FIG. 17 is a flow diagram showing how the coolant flow system of FIG. 16 is connected to the ECU of FIGS. 1–3.

FIG. 17 is a flow diagram of the coolant flow system 286 of engine 101 connected to ECU 100 and the fuel supply connected to the fuel injectors in order to fuel engine 101. System 286 and a fuel supply/fuel return system 288 for a 4-cylinder engine would be similar for a 6-cylinder engine, except there would be additional fuel supply and return lines. In coolant flow system 286, water from the environment enters lower unit 276 (shown in FIG. 16) via a port adapter and to a water pump 279(shown in FIG. 16). From pump 279, water passes through a mid-section 280 (shown in FIG. 16) into powerhead 102 to the inlet 291 of a unit 292 through an inlet waterline 293. This coolant then flows from unit 292 through an outlet 294 and then through a coolant supply line 296 to the inlet 136 of water passage 134, through water passage 134, out of the outlet 138, and then on through a cooling water drain line 300 and then back to the environment through the lower unit 276. This cools at least a portion of ECU 100.

FIG. 17 also shows the fuel supply system 288. Fuel enters system 288 through the fuel supply hose 302 from a fuel tank 304 past a sensor 306 and a second fuel line 308 to a fuel regulator 310. The fuel then passes through the jacket of the unit 292 to a fuel pump 312. From the fuel pump 312, the fuel passes through a third fuel line 314 to a fuel distribution block 316, where it is divided into four supplies for four fuel injectors 254, 256, 258 and 260. Any excess fuel from the fuel injectors is returned via fuel return lines 318, 320, 322, 324 to a second fuel junction block 326. From this second fuel junction block 326 the fuel then returns through a return line 328 to the fuel regulator 310 to repeat the fuel supply cycle. Fuel return line 328 is provided with a test point 330 for purposes of verifying adequate fuel flow.

Figure 18:
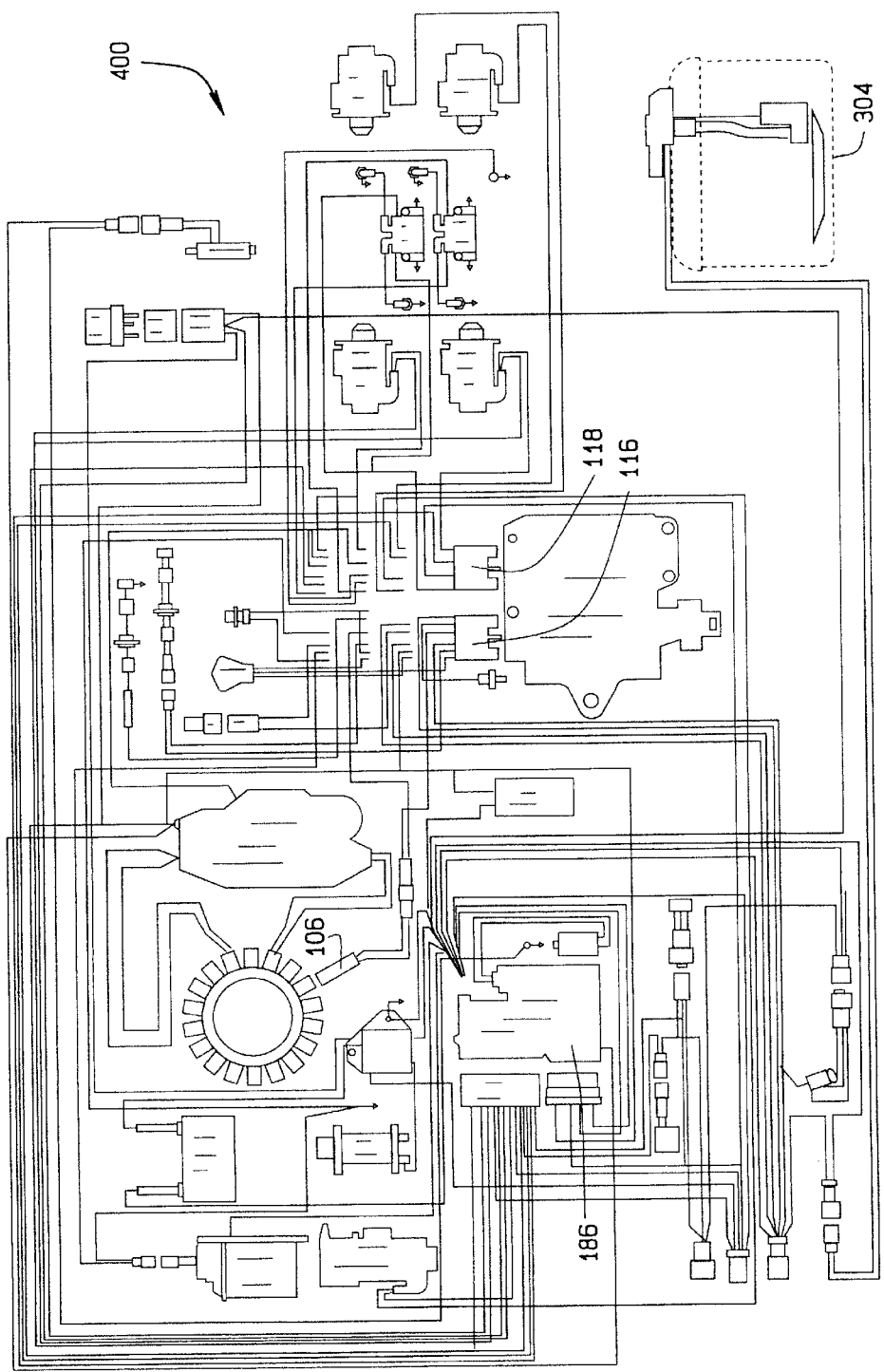
FIG. 18 is a schematic drawing of the electric wiring for the marine engine of FIGS. 1–2 showing how the main engine parts are electrically connected.

FIG. 18 is a schematic drawing of an overall electric wiring system 400 for engine 101 exemplifying how the main engine parts can be electrically connected. Power distribution panel 186 provides power for system 400. The sensor circuits lead to connector 116. Ignition circuits 178 are connected to ECU 100 through connector 118. Crankshaft position sensor 106 is part of system 400. System 400 further includes fuel injector circuits and fuel supply tank 304.

While the invention has been described in terms of various specific embodiments, those skilled in the art will recognize that the invention can be practiced with modification within the spirit scope of the claims.

What is claimed is:

1. A method of cooling an ECU for an internal combustion engine in a marine propulsion system having a lower unit extending into a body of water, the ECU including a housing containing control circuitry, the housing having a water cooling passage in heat transfer adjacency to and extending above said circuitry, said method comprising the steps of:
   introducing water into the engine through the lower unit;
   passing the introduced water to the cooling passage of the ECU above the circuitry to dissipate heat therefrom; and
   returning the heated water back to the body of water.

2. A method in accordance with claim 1 further comprising the step of passing the water through the engine in close proximity to and, in heat transfer adjacency with, a fuel pump.

3. A method in accordance with claim 1 further comprising the step of generating an ignition current within the ECU and selectively periodically supplying that current to a plurality of ignition coils outside of the ECU.

4. A method in accordance with claim 3 further comprising the step of passing the water through a passageway in heat transfer adjacency to, but electrically isolated from, a portion of the ECU which is generating the ignition current.

5. An ECU for a marine propulsion system, said ECU comprising:
   heat-producing circuitry; and
   a housing containing said circuitry and comprising a water coolant passageway in heat transfer adjacency above said circuitry and adapted to remove heat therefrom.

6. An ECU in accordance with claim 5 wherein said electrical circuitry has a high power portion and a low-power portion, said coolant passageway in heat transfer adjacency to the high power portion.

7. An ECU in accordance with claim 5 wherein said water passageway is integral with said housing.

8. An ECU in accordance with claim 7 wherein the water passageway is disposed on top of the ECU.

9. An ECU in accordance with claim 7 wherein the water passageway is disposed adjacent one edge of the top of the ECU.

10. An ECU in accordance with claim 5 wherein the water passageway has an inlet connector and an outlet connector, both adapted to receive a water hose.

11. An ECU for a combustion engine, said ECU comprising:
   a housing comprising a top and a water passage therethrough;
   electrical input circuits, located within the housing;
   electrical control circuits, located within the housing;
   electrical fuel injection output drive circuits, located within the housing; electrical oil pump output drive circuits, located within the housing; and a portion of the electrical ignition circuit immediately prior to the ignition coils located within the housing, so that the ECU can communicate electrically with the ignition coils.

12. An ECU in accordance with claim 1, said water coolant passageway in heat transfer adjacency to at least one of the electrical circuits and adapted to remove heat therefrom.

13. An ECU in accordance with claim 12 wherein at least one of the electrical circuits has a high-power portion and one or more of the electrical circuits has a low-power portion, both said high-power and low-power portions are located within said ECU, and said coolant passageway is in heat transfer adjacency to the high-power portion.

14. An ECU in accordance with claim 11 wherein the engine is a marine engine operatively controlled by the ECU.

15. An ECU in accordance with claim 14 wherein the engine is an outboard engine.

16. An ECU in accordance with claim 14 wherein the engine is an inboard engine.

17. An ECU in accordance with claim 14 wherein the engine is an inboard/outboard engine.

18. An ECU in accordance with claim 14 wherein the marine engine is water-cooled.

19. A coolant kit for an ECU of an internal combustion engine comprising:
   a housing comprising a top and a water passageway therein adapted to be placed in heat transfer adjacency to a first part of the ECU and having an inlet and an outlet;
   a water inlet conduit adapted to be connected to a source of liquid coolant flowing through the engine and to an inlet of the water passageway and to provide fluid communication therebetween; and
   a water outlet passageway adapted to be connected to a liquid coolant removal device and to an outlet of the water passageway and to provide fluid communication therebetween, so as to dispose of water exiting the water passageway and to conduct heat away from the ECU.

20. A kit in accordance with claim 19 further comprising means for connecting the water passageway to the top of the ECU.

21. A kit in accordance with claim 19 wherein the water passageway is enclosed in a housing having a rounded portion and a flat portion, the flat portion being adapted to be placed in close contact with a corresponding flat portion of an ECU.

22. A method of cooling a heat-generating electrical circuit in a marine propulsion system, the method comprising the steps of:
   (a) diverting through the system a portion of the water through which the motor is providing propulsion; and
   (b) routing the water in heat transfer communication with the circuitry and above the circuitry.

23. The method of claim 22 wherein the electrical circuit is at least part of an ECU.

24. The method of claim 22 wherein the motor is an internal combustion engine.

25. The method of claim 22 wherein the heat transfer communication includes heat transfer by convection of the diverted water.

26. The method of claim 22 wherein the heat transfer communication includes movement of the diverted water by convection.

27. The motor of claim 24 wherein the heat transfer communication includes heat transfer by convection of water through the passageway.

28. The method of claim 22 wherein the heat transfer communication includes heat transfer by radiation from the circuitry to a body and conduction from the body to the diverted water.

29. A motor used for propulsion through water, the motor comprising:
  (a) heat-generating circuitry used in the operation of the motor; and
  (b) a water passageway in heat transfer communication with the circuitry, the passageway in fluid communication with, and adapted to receive water diverted from, the water through which the engine is providing propulsion, said passageway extending above the circuitry in operation in the motor.

30. The motor of claim 29 wherein the circuitry is at least part of an ECU.

31. The motor of claim 29 wherein the motor is an internal combustion engine.

* * * * *

UNITED STATES PATENT AND TRADEMARK OFFICE
CERTIFICATE OF CORRECTION

PATENT NO. : 6,604,494 B2
DATED : August 12, 2003
INVENTOR(S) : Skrzypchak et al.

It is certified that error appears in the above-identified patent and that said Letters Patent is hereby corrected as shown below:

<u>Column 10,</u>
Line 5, delete the number "1" and substitute therefore -- 11 --;

Signed and Sealed this

Twenty-seventh Day of April, 2004

JON W. DUDAS
*Acting Director of the United States Patent and Trademark Office*